(12) United States Patent
Quesada et al.

(10) Patent No.: US 9,050,621 B2
(45) Date of Patent: Jun. 9, 2015

(54) SURFACE NANOFABRICATION METHODS USING SELF-ASSEMBLED POLYMER NANOMASKS

(71) Applicants: Mark Alejandro Quesada, Horseheads, NY (US); Jianguo Wang, Horseheads, NY (US); Ying Zhang, Horseheads, NY (US)

(72) Inventors: Mark Alejandro Quesada, Horseheads, NY (US); Jianguo Wang, Horseheads, NY (US); Ying Zhang, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 16 days.

(21) Appl. No.: 13/748,840

(22) Filed: Jan. 24, 2013

(65) Prior Publication Data

US 2014/0202984 A1    Jul. 24, 2014

(51) Int. Cl.
*C25F 3/00*        (2006.01)
*H01B 13/00*     (2006.01)
(Continued)

(52) U.S. Cl.
CPC . *B05D 5/00* (2013.01); *B82Y 40/00* (2013.01); *Y10S 977/888* (2013.01); *G03F 7/0002* (2013.01); *B82Y 10/00* (2013.01)

(58) Field of Classification Search
CPC .......... B01D 2325/028; B01D 67/003; B01D 67/0034; B01D 67/0072; B01D 71/28; B01D 71/80; B82Y 10/00; B82Y 30/00; G03F 7/0002; B81C 1/00031; H01L 21/02118; H01L 21/02203; H01L 21/02282; H01L 21/02337; H01L 21/32139
USPC ............. 216/2, 12, 13, 17, 20, 22, 25, 43, 48, 216/49, 11, 47, 50, 55, 56, 57, 58, 67, 83; 438/22, 29, 694, 780, 689, 72, 591, 438/618, 637, 666, 31, 42, 510, 517, 57, 438/585, 586, 682, 684, 697, 700, 702, 800, 438/93, 704, 706, 707, 710, 717, 726, 745; 977/762, 888, 755, 700, 773, 810, 900, 977/901, 906, 915; 427/256, 385.5, 240, 427/198, 259, 98.4, 258
See application file for complete search history.

(56) References Cited

U.S. PATENT DOCUMENTS 6,565,763 B1 * 5/2003 Asakawa et al. ................ 216/56
7,347,953 B2 * 3/2008 Black et al. ..................... 216/83
(Continued)

FOREIGN PATENT DOCUMENTS

EP        2 594 995        5/2013
WO      2013/152928     10/2013

OTHER PUBLICATIONS

PCT Application No. PCT/US2014/12228, filed Jan. 21, 2014, PCT Search Report dated May 9, 2014.
(Continued)

*Primary Examiner* — Nadine Norton
*Assistant Examiner* — Christopher Remavege
(74) *Attorney, Agent, or Firm* — Michael W Russell

(57) ABSTRACT

Methods for fabricating a nanopillared substrate surface include applying a polymer solution containing an amphiphilic block copolymer and a hydrophilic homopolymer to a substrate surface. The amphiphilic block copolymer and the hydrophilic homopolymer in the polymer solution self-assemble on the substrate surface to form a self-assembled polymer layer having hydrophobic domains adjacent to the substrate surface and hydrophilic domains extending into the self-assembled polymer layer. At least a portion of the hydrophilic domains may be removed to form a plurality of pores in the exposed surface of the self-assembled polymer layer. A protective layer may be deposited on the exposed surface as a mask for etching through the plurality of pores to form through-holes. A nanopillar-forming material may be deposited onto the substrate surface via the through-holes. Then, the remaining portion of the self-assembled polymer layer may be removed to expose a nanopillared substrate surface.

20 Claims, 7 Drawing Sheets

(51) Int. Cl.
*B44C 1/22* (2006.01)
*H01L 21/302* (2006.01)
*H01L 21/461* (2006.01)
*B05D 5/00* (2006.01)
*B82Y 40/00* (2011.01)
*G03F 7/00* (2006.01)
*B82Y 10/00* (2011.01)

(56) References Cited

U.S. PATENT DOCUMENTS

| | | | |
|---|---|---|---|
| 8,071,467 B2 * | 12/2011 | Millward et al. | 438/591 |
| 8,501,304 B2 * | 8/2013 | Stoykovich et al. | 428/195.1 |
| 8,641,914 B2 * | 2/2014 | Regner | 216/17 |
| 8,835,325 B2 * | 9/2014 | Haiyang et al. | 438/702 |
| 2008/0230514 A1 * | 9/2008 | Park et al. | 216/41 |
| 2008/0318005 A1 | 12/2008 | Millward | 428/172 |
| 2009/0078673 A1 * | 3/2009 | Kihara et al. | 216/11 |
| 2009/0092803 A1 | 4/2009 | Bita et al. | 428/209 |
| 2009/0236309 A1 | 9/2009 | Millward et al. | 216/39 |
| 2009/0274887 A1 | 11/2009 | Millward et al. | 428/221 |
| 2010/0086801 A1 * | 4/2010 | Russell et al. | 428/551 |
| 2011/0201201 A1 * | 8/2011 | Arnold et al. | 438/694 |
| 2011/0232515 A1 * | 9/2011 | Millward | 101/333 |
| 2011/0250745 A1 | 10/2011 | Millward et al. | 438/591 |
| 2012/0196094 A1 | 8/2012 | Xu et al. | 428/195.1 |
| 2012/0202017 A1 * | 8/2012 | Nealey et al. | 428/195.1 |
| 2014/0011013 A1 | 1/2014 | Jin et al. | 428/297.4 |
| 2014/0091435 A1 * | 4/2014 | Chan et al. | 257/618 |

OTHER PUBLICATIONS

J. Gao, et al., "Fabrication of polymer antireflective coatings by self-assembly of supramolecular block polymer", *Polymer*, 2010, vol. 50, pp. 2683-2689.

W. Joo, et al., "Block Copolymer Film with Sponge-Like Nanoporous Structure for Antireflective Coating", *Langmuir*, 2006, vol. 22, pp. 7960-7963.

C.Y. Kuo, et al., "A Facile Route to Create Surface Porous Polymer Films via Phase Separation for Antireflection Applications", *Applied Materials & Interfaces*, 2009, vol. 1, No. 1, pp. 72-75.

W. Lee, et al., "A simple method for creating nanoporous block-copolymer thin films", *Polymer*, 2010, vol. 51, pp. 2376-2382.

N. Lefevre, et al., "Self-Assembly in Thin Films of Mixtures of Block Copolymers and Homopolymers Interacting by Hydrogen Bonds", *Macromolecules*, 2010, vol. 43, pp. 7734-7743.

X. Li, et al., "Broadband antiflection of block copolymer/homopolymer blend films with gradient refractive index structures", *Journal of Materials Chemistry*, 2011, vol. 21, pp. 5817-5827.

X. Li, et al., "Porous Polymer Films with Gradient-Refractive-Index Structure for Broadband and Omnidirectional Antireflection Coatings", *Advanced Functional Materials*, 2010, vol. 20, pp. 259-265.

Y. Lu, et al., "pH-Induced Antireflection Coatings Derived From Hydrogen-Bonding-Directed Multilayer Films", *Langmuir*, 2010, vol. 26, No. 22, pp. 17749-17755.

B. Päivänranta, et al., "Nanofabrication of Broad-Band Antireflective Surfaces Using Self-Assembly of Block Copolymers", *ACS Nano*, 2011, vol. 5, No. 3, 2011, pp. 1860-1864.

C. Park et al., "Enabling nanotechnology with self assembled block copolymer patterns", Polymer, 2003, vol. 44, No. 22, pp. 6725-6760.

M. Park, et al., "Large Area Dense Nanoscale Patterning of Arbitrary Surfaces", *Applied Physics Letters*, 2001, vol. 70, pp. 257-259.

Y. Qiao, et al., "Block Polymer Templated Etching on Silicon", 2007, *Nano Letters*, vol. 7, No. 2, pp. 464-469.

S. Walheim, et al., "Nanophase-Separated Polymer Films as High-Performance Antireflections Coatings", *Science*, 1999, vol. 283, pp. 520-522.

* cited by examiner

| SAMPLE NAME | PROCESSED FINGERPRINT STAMP IMAGE | PROCESSED INTEGRATED INTENSITY | % TRANS. (> 90%) | % HAZE (< 4%) |
|---|---|---|---|---|
| BARE 2318 |  | 970994 $\Delta$ = 00.0 % | — | — |
| EC 173 |  | 853814 $\Delta$ = 12.1 % | 94% | 0.3% |
| NANOPILLARED |  | 758642 $\Delta$ = 22.9 % | 93% | 7.7% |

FIG. 7

SURFACE NANOFABRICATION METHODS USING SELF-ASSEMBLED POLYMER NANOMASKS

BACKGROUND

1. Field

The present specification generally relates to materials for and methods of masking surfaces and forming nanoscale three-dimensional structures, and more specifically, to block copolymers in combination with homopolymers for use in forming nanomasks and dimensionally-modified surfaces. Methods of making and using related devices are also disclosed.

2. Technical Background

Engineering nano-textured post or hole patterns onto surfaces at low cost is commercially desirable for many applications, including anti-glare, anti-smudge de-wetting properties associated with modern touch-screens, and anti-reflective and scattering optical properties related to photovoltaic glass substrates. Previously, it has been a challenge to produce commercially-viable, cost-effective nanoscale patterns having specific pitch and diameter requirements over large areas.

SUMMARY

Embodiments of the present disclosure relate to surface nanofabrication techniques having low production costs. Some embodiments include depositing a block copolymer and homopolymer mixture as a thin film onto a substrate, and further processing the thin film to form nanoholes into which a material may be deposited to produce a textured substrate surface having elements with dimensions on the nanometer scale. The processes involved are scalable to large surface areas, may be performed at room temperature, and use modest polymer removal and thin film deposition processes to enable large-scale nano-textured surface fabrication at lower manufacturing costs.

According to some embodiments, methods for fabricating a nanopillared substrate surface may include applying to a substrate surface of a substrate a polymer solution. The polymer solution may contain an amphiphilic block copolymer having hydrophobic blocks and hydrophilic blocks; a hydrophilic homopolymer that is chemically compatible with the hydrophilic blocks of the amphiphilic block copolymer; and an application solvent. The amphiphilic block copolymer and the hydrophilic homopolymer in the polymer solution may be allowed to self-assemble on the substrate surface to form a self-assembled polymer layer. The self-assembled polymer layer may include hydrophobic domains adjacent to the substrate surface and hydrophilic domains extending into the self-assembled polymer layer from an exposed surface of the self-assembled polymer layer opposite the substrate surface. The methods may further include removing at least a portion of the hydrophilic domains to form a plurality of pores in the exposed surface of the self-assembled polymer layer. Then, a protective layer such as a metal layer or a dielectric layer may be deposited on the exposed surface. With the protective layer on the exposed surface, the self-assembled polymer layer may be etched through the plurality of pores to form through-holes through the self-assembled polymer layer to the substrate surface. The methods may further include depositing a nanopillar-forming material onto the substrate surface through the through-holes and subsequently removing the self-assembled polymer layer to expose a nanopillared substrate surface having a plurality of nanopillars thereon.

Additional features and advantages of the embodiments described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 7 depicts anti-smudge characteristics of various substrates, including substrates having nanopillared surfaces prepared according to embodiments described herein.

DETAILED DESCRIPTION

Reference will now be made in detail to embodiments of methods for fabricating a nanopillared substrate surface. Initially, an exemplary embodiment of a method for fabricating a nanopillared substrate surface will be described in summary with reference to FIGS. 1A-5B. Then, various embodiments of methods for fabricating a nanopillared substrate surface will be described in detail to highlight particular features related to the methods, components and apparatus involved in carrying out the methods, steps performed during the methods, and results attainable from using the methods.

Figure 1A:
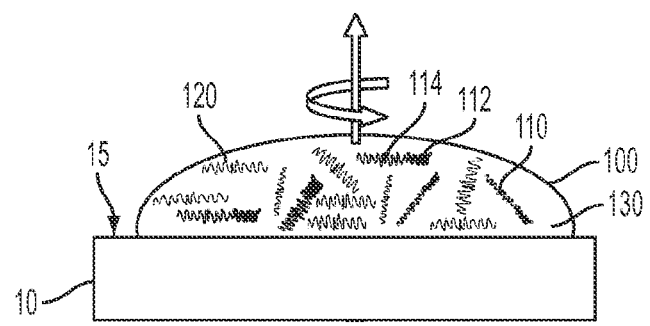
FIG. 1A schematically depicts an application of a polymer solution according to embodiments described herein.
Figure 1B:
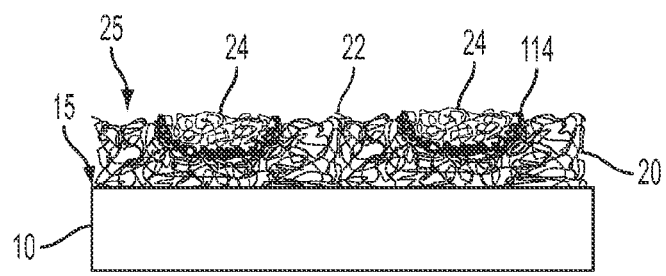
FIG. 1B schematically depicts a self-assembled polymer layer with hydrophilic and hydrophobic domains on a substrate surface.

Referring to FIG. 1A, the methods described herein for fabricating a nanopillared substrate surface may include applying a polymer solution 100 to a substrate surface 15 of a substrate 10. The polymer solution 100 may contain an amphiphilic block copolymer 110 having hydrophobic blocks 112 and hydrophilic blocks 114; a hydrophilic homopolymer 120 that is chemically compatible with the hydrophilic blocks 114 of the amphiphilic block copolymer 110; and an application solvent 130. The amphiphilic block copolymer 110 and the hydrophilic homopolymer 120 in the polymer solution 100 may be allowed to self-assemble on the substrate surface 15 to form a self-assembled polymer layer 20. The self-assembly of the amphiphilic block copolymer 110 and the hydrophilic homopolymer 120 is represented in FIG. 1B. The self-assembled polymer layer 20 may include hydrophobic domains 22 adjacent to the substrate surface 15 and hydrophilic domains 24 extending into the self-assembled polymer layer from an exposed surface 25 of the self-assembled polymer layer 20 opposite the substrate surface 15. Thereby, the self-assembly process may result in a transitional region between the hydrophobic domains 22 and the hydrophilic domains 24, the transitional region being made up from the hydrophilic blocks 114 of the amphiphilic block copolymer 110.

Figure 1C:
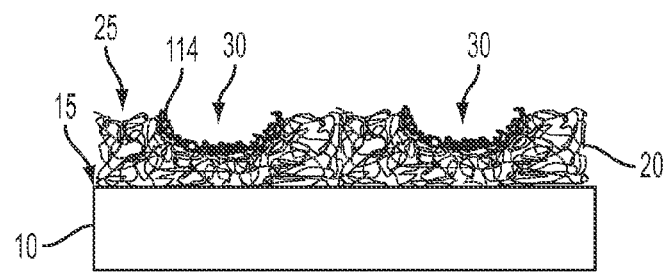
FIG. 1C schematically depicts a self-assembled polymer layer with pores formed after removal of hydrophilic domains.

Referring to FIGS. 1B and 1C, the methods described herein for fabricating a nanopillared substrate surface may further include removing at least a portion of the hydrophilic domains 24 to form a plurality of pores 30 in the exposed surface 25 of the self-assembled polymer layer 20. Examples of a porous surface structure such as the one represented in FIG. 1C are provided in the SEM micrographs of FIGS. 2A and 2B.

Figure 3A:
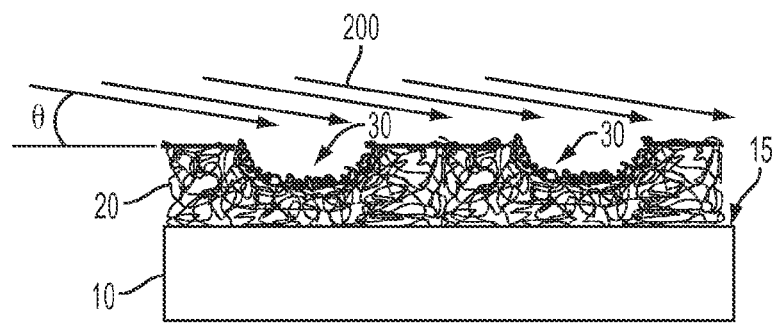
FIG. 3A schematically depicts deposition of a metal layer on an exposed surface of a self-assembled polymer layer by glancing angle metal deposition according to embodiments described herein.
Figure 3B:
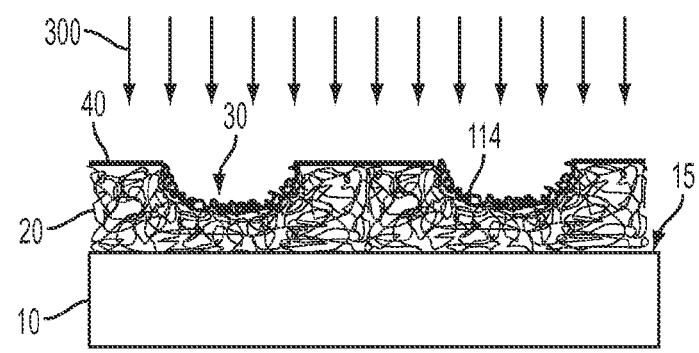
FIG. 3B schematically depicts etching of through-holes into the self-assembled polymer layer according to embodiments described herein.
Figure 3C:
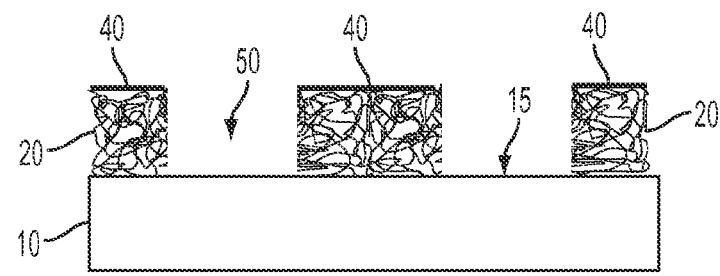
FIG. 3C schematically depicts a self-assembled polymer layer having through-holes after the etching depicted in FIG. 3B.

Referring to FIG. 3A, a protective layer 40 such as a metal layer or a dielectric layer may be deposited on the exposed surface 25. In the exemplary embodiment of FIG. 3A, the protective layer 40 is applied by grazing angle deposition, wherein the deposition material 200 may be applied at a glancing angle θ with respect to the exposed surface 25. Referring to FIGS. 3B and 3C, with the protective layer 40 on the exposed surface 25, the self-assembled polymer layer 20 may be treated by etching with an etchant stream 300, for example, through the plurality of pores 30 to form through-holes 50 through the self-assembled polymer layer 20 to the substrate surface 15.

Figure 4A:
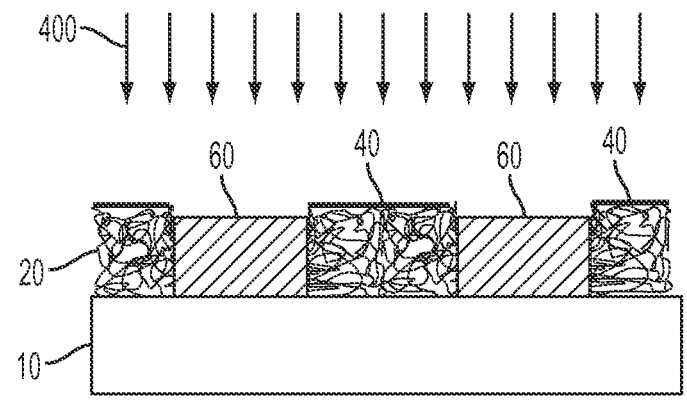
FIG. 4A schematically depicts deposition of a nanopillar-forming material into through-holes in the self-assembled polymer layer according to embodiments described herein.
Figure 4B:
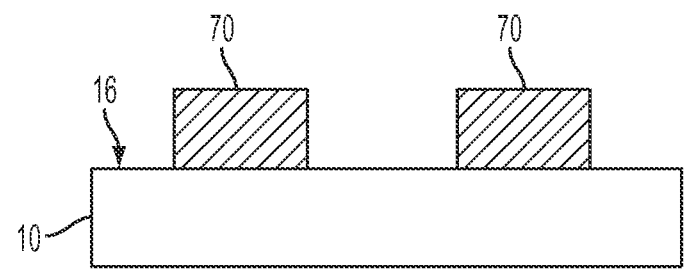
FIG. 4B schematically depicts a substrate having a nanopillared surface with a plurality of nanopillars formed according to embodiments described herein.

Referring finally to FIGS. 3C, 4A, and 4B, the methods described herein for fabricating a nanopillared substrate surface may further include depositing a nanopillar-forming material 60 onto the substrate surface 15 through the through-holes 50. In FIG. 4A, the nanopillar-forming material 60 is shown accumulating in the through holes after being deposited from a deposition stream 400 such as a vapor or liquid stream. Once the nanopillar-forming material 60 is deposited, the remaining portions of the self-assembled polymer layer 20 may be removed to expose a nanopillared substrate surface 16 having a plurality of nanopillars 70 thereon. Because the plurality of nanopillars 70 may be made from the nanopillar-forming material 60, in some embodiments the plurality of nanopillars 70 may have the same composition as the substrate 10, the substrate surface 15, or both. For example, the plurality of nanopillars 70 may be made of glass when the substrate 10 itself is glass. Illustrative examples of a nanopillared substrate surface 16 formed according to embodiments described herein are provided in FIGS. 5A and 5B.

Having described one exemplary embodiment of the methods for fabricating a nanopillared substrate surface, now various embodiments and modifications to the exemplary embodiment will be described in greater detail.

According to some embodiments, the methods for fabricating a nanopillared substrate surface may include applying a polymer solution to a substrate surface of a substrate. The substrate may be any substrate having surfaces that are chemically compatible with the polymer solutions described below, such that when the polymer solution is applied to a surface of the substrate, components of the polymer solution self-assemble to form hydrophobic domains and hydrophilic domains that can be separately and independently treated or manipulated to form surface structures on the substrate surface. In some embodiments, the substrate may be selected from materials that can be patterned by the methods embodied herein including, but not limited to, metals, metal oxides, polymers, silica, glass ceramics, ceramics, and glasses. Exemplary glasses include, without limitation, silicate glasses, borosilicate glasses, aluminosilicate glasses, aluminoborosilicate glasses, soda lime glasses, and Gorilla™ Glass (an alkali-metal aluminosilicate glass toughened by ion exchange of potassium for sodium), for example. In some embodiments, the substrate may comprise or consist of a glass, a glass ceramic, a metal or a metal oxide. In some embodiments, the substrate may comprise glass or a glass surface. In some embodiments, the substrate consists of glass. In other embodiments, the substrate may comprise a metal or a metal oxide.

The polymer solution applied to the substrate surface may contain an amphiphilic block copolymer having hydrophobic blocks and hydrophilic blocks, a hydrophilic homopolymer that is chemically compatible with the hydrophilic blocks of the amphiphilic block copolymer, and an application solvent.

The amphiphilic block copolymers according to some embodiments are formed from polymer blocks. The polymer blocks of each amphiphilic block copolymer include hydrophobic blocks and hydrophilic blocks. Thus, the block copolymers embodied herein may comprise hydrophobic sections and hydrophilic sections. The hydrophobic sections comprise hydrophobic moieties such as, but not limited to, poly(alkyl acrylates), poly(alkyl methacrylates), polystyrenes, polyalkylene such as polyethylenes or polypropylenes, or polybutadienes. In some embodiments, the hydrophobic blocks may include polystyrenes. The hydrophilic sections may comprise hydrophilic moieties or oligomers such as, but not limited to, poly(acrylic acid), poly(methacrylic acid), polyisoprenes, polyvinylpyridines, or polyalkylene oxides such as polyethylene oxide. In some embodiments, the hydrophilic section comprises polyethylene oxide. In one illustrative embodiment, the hydrophobic section may comprise polystyrene and the hydrophilic section may comprise polyethylene oxide.

Specific non-limiting examples of amphiphilic block copolymers that can be used for forming self-assembled polymer layers on substrate surfaces include polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxideblock-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), polyvinylpyridine-block-polymethylmethacrylate (PVP-b-PMMA), polystyrene-block-polybutadiene (PS-b-PBD), and polyisoprene-block-polymethylmethacrylate (PI-b-PMMA). In an illustrative embodiment, the amphiphilic block copolymer may comprise a polystyrene-block-polyethyleneoxide (PS-b-PEO) block copolymer having polystyrene hydrophobic blocks and polyethylene oxide hydrophilic blocks.

Exemplary classes of amphiphilic block copolymers suitable for use in embodiments herein include, but are not limited to, linear diblock, triblock, and multiblock copolymers, star copolymers, and graft copolymers. Without intent to be bound by theory, it is believed that in a given block copolymer system, the relative chain lengths of the blocks determine the resulting morphology of a self-assembled polymer layer that may be formed on a substrate surface. In some embodiments, the amphiphilic block copolymer may be substantially monodisperse. In particular, in such embodiments the amphiphilic block copolymer may have a polydispersity index of from 1.00 to about 1.20, or from about 1.02 to about 1.15, or from about 1.02 to about 1.10. The polydispersity index of the amphiphilic block copolymer refers to the ratio $M_W/M_N$ of the amphiphilic block copolymer, where $M_W$ is the weight-average molecular weight of the amphiphilic block copolymer and $M_N$ is the number-average molecular weight of the amphiphilic block copolymer.

In some embodiments, the hydrophobic blocks may compose from about 60 wt. % to about to about 98 wt. %, or about 75 wt. % to about 98 wt. % of the amphiphilic block copolymer, based on the total weight of the amphiphilic block copolymer. In some embodiments, the amphiphilic block copolymer may have a number-average molecular weight ($M_N$) of from about 100,000 Dalton to about 500,000 Dalton. Non-limiting illustrative compositions of amphiphilic block copolymers may include, for example, PS-b-PEO block copolymers with $M_N$ of 105,000-b-3,000; 150,000-b-35,000; 225,000-b-26,000; or 384,000-b-8,000. These illustrative compositions may additionally be substantially monodisperse, with polydispersity indices of from about 1.00 to about 1.20, for example.

The polymer solution further includes a hydrophilic homopolymer that is chemically compatible with the hydrophilic blocks of the amphiphilic block copolymer. Chemical compatibility of the hydrophilic homopolymer with the hydrophilic blocks of the amphiphilic block copolymer may result in the formation of hydrophilic domains of the hydrophilic homopolymer in the self-assembled polymer layer because the hydrophilic homopolymer may maintain a chemical affinity to the hydrophilic blocks of the amphiphilic block copolymer and thereby influence the morphology of the self-assembled polymer layer.

In non-limiting illustrative embodiments, the hydrophilic homopolymer may include a poly(acrylic acid), for example. Particularly in embodiments for which the hydrophilic blocks of the amphiphilic block copolymer are polyethylene oxide, a poly(acrylic acid) hydrophilic homopolymer is believed to have a high level of chemical compatibility with the polyethylene oxide, such that hydrophilic domains of the hydrophilic homopolymer readily form in the self-assembled polymer layer.

In some embodiments, the hydrophilic homopolymer may have number-average molecular weights ($M_N$) of from about 2000 Dalton to about 30,000 Dalton. Nevertheless, it is contemplated that the hydrophilic homopolymer may have number-average molecular weights ($M_N$) less than 2000 Dalton or greater than 30,000 Dalton. In some embodiments, the hydrophilic homopolymer may be substantially monodisperse. In particular, in such embodiments the hydrophilic homopolymer may have a polydispersity index of from 1.00 to about 1.20, or from about 1.02 to about 1.15, or from about 1.02 to about 1.10. In non-limiting illustrative embodiments, the hydrophilic homopolymer may include a poly(acrylic acid) having a number-average molecular weight of from about 2000 Dalton to about 30,000 Dalton or from about 5000 Dalton to about 27,000 Dalton, with a polydispersity index of from about 1.05 to about 1.15.

Without intent to be bound by theory, it is believed that the weight ratio of the amphiphilic block copolymer to the hydrophilic homopolymer in the polymer solution may affect one or more of the morphology of the self-assembled polymer layer, the size of pores that may be formed by removing hydrophilic domains, or the area fraction of pores on the exposed surface of the self-assembled polymer layer. In some embodiments, the weight ratio of the amphiphilic block copolymer to the hydrophilic homopolymer in the polymer solution is from about 1:1 to about 10:1, for example from about 1.5:1 to about 10:1, from about 2:1 to about 9:1, or from about 2:1 to about 5:1, or from about 2:1 to about 4:1. In some embodiments, increasing the ratio of the amphiphilic block copolymer to the hydrophilic homopolymer in the polymer solution may result in formation of hydrophilic domains that are smaller and represent a smaller area fraction of the exposed surface of the self-assembled polymer layer.

The polymer solution may further include an application solvent. In some embodiments, the application solvent may be any solvent that at least partially dissolves both the amphiphilic block copolymer and the hydrophilic homopolymer. In some embodiments, the application solvent may be any solvent used in a sufficient amount so as to completely dissolve both the amphiphilic block copolymer and the hydrophilic homopolymer into the polymer solution. It is believed that the level of dissolution of the amphiphilic block copolymer and the hydrophilic homopolymer may relate to the evenness in thickness of the application of the polymer solution, particularly when deposition techniques such as spin coating or dip coating may be used. Exemplary application solvents in embodiments herein may include, without limitation, organic solvents such as toluene, tetrahydrofuran, propylene glycol monomethyl ether acetate (PGMEA), propylene glycol monomethyl ether (PGME), acetone, or benzene. In an illustrative embodiment, the application solvent may comprise or consist of tetrahydrofuran.

In some embodiments, the amount of application solvent as a weight percent of the polymer solution may depend on the molecular weights of the polymers. In some embodiments, the polymer solution may contain from about 0.02 wt. % to about 4 wt. % total polymer (amphiphilic block copolymer and hydrophilic homopolymer), based on the total weight of the polymer solution, with the remaining 96 wt. % to 99.98 wt. % being application solvent.

In exemplary embodiments, the polymer solution may be applied to the substrate surface by any suitable method for coating substrates with polymer solutions. For example, the polymer solution may be applied to the substrate surface by spin coating or dip coating. In other embodiments, the polymer solution may be applied by spray coating, roll coating, or by a printing process such as screen printing. In some embodiments, the polymer solution may be prepared in advance of its application, for example, by mixing the amphiphilic block copolymer, the hydrophilic homopolymer, and the application solvent together to form a mixture, such that the mixture is applied to the substrate surface. In other embodiments, the amphiphilic block copolymer and the hydrophilic homopolymer may be separately dissolved in one or more application solvents to form two separate solutions. Then, each of the separate solutions may be applied to the substrate surface in any order by any suitable technique, including but not limited to those described above.

The amphiphilic block copolymer and the hydrophilic homopolymer in the polymer solution may be allowed to self-assemble on the substrate surface to form a self-assembled polymer layer. In some embodiments, the self-assembly occurs without assistance as the application solvent is removed by evaporation, with or without gentle heating. The combination of the amphiphilic block copolymer and the hydrophilic homopolymer creates a two-component polymeric structure on the substrate. In some embodiments, the two-component polymeric structure comprises a continuous phase of one component and a dispersed phase of the other component. In some embodiments, the dispersed phase comprises one or more three-dimensional structures such as columnar structures comprising either the block copolymer or the homopolymer. In some embodiments, the dispersed phase may comprise one or more homogeneous polymers and the continuous phase may comprise a block copolymer. In other embodiments, the dispersed phase may comprise one or more block copolymers and the continuous phase may comprise a homopolymer. In some embodiments, the dispersed phase may comprise hydrophobic domains of block copolymers wherein the hydrophilic groups are concentrated in hydrophilic domains adjacent to the hydrophobic domains, such that hydrophilic ends of the block copolymer line up to face the hydrophilic domains. In some embodiments, the one or more hydrophilic domains are concentrated at the surface of the film formed by the polymeric structure. In some embodiments, one or more hydrophilic domains are concentrated at the substrate surface.

In some embodiments, the two phases are immiscible. In some embodiments, the two phases form an emulsion. In some embodiments, the emulsion is an unstable emulsion. In some embodiments, the unstable emulsion results in the dispersed phase concentrating at the surface of the film formed by the polymeric structure. In some embodiments, the unstable emulsion results in the dispersed phase concentrating on the substrate.

The domain sizes of the hydrophilic domains formed in the dispersed phase may vary from about 50 nm to about 400 nm or from about 100 nm to about 300 nm or from about 100 nm to about 250 nm. In some embodiments, the hydrophilic domains may have an average diameter of from about 120 nm to about 250 nm. The hydrophilic domains may be evenly dispersed in the continuous phase or may be concentrated at the exposed surface of the self-assembled polymer layer or on or near the substrate surface. In some embodiments, the hydrophilic domains may be concentrated at the exposed surface of the self-assembled polymer layers and may represent an area fraction of the exposed surface of the self-assembled polymer layer. In some embodiments, the self-assembled polymer layer may include hydrophobic domains adjacent to the substrate surface and hydrophilic domains extending into the self-assembled polymer layer from an exposed surface of the self-assembled polymer layer opposite the substrate surface. The area fraction may describe the fraction of the exposed surface having an area consisting of hydrophilic domains, based on the total surface area of the exposed surface. In illustrative embodiments, the exposed surface of the self-assembled polymer layer may have an area fraction of hydrophilic domains of from about 5% to about 60%, or from about 10% to about 50%, or from about 10% to about 40%, or from about 20% to about 40%, or from about 20% to about 30%.

The methods for fabricating a nanopillared substrate surface may further include removing at least a portion of the hydrophilic domains to form a plurality of pores in the exposed surface of the self-assembled polymer layer. In some embodiments, the hydrophilic domains that are removed to form the plurality of pores may be concentrated at or near the exposed surface of the self-assembled polymer layer. In some embodiments, the hydrophilic domains may be removed by physical techniques such as reactive-ion etching. In other embodiment, the hydrophilic domains may be removed by wet chemical techniques such as selective etching or washing in a polar solvent such as water or alcohols such as methanol, ethanol, propanol, or isopropanol. In illustrative embodiments, the hydrophilic domains may be removed by selectively etching the self-assembled polymer layer in water or ethanol for an etching period of from 2 minutes to 10 minutes, for example.

Selective chemistry may also be used to chemically modify one or more block copolymer components to alter their etching rate. Various means to selectively, chemically modify one or more block copolymers are known. For example, the polyisoprene (PI) or polybutadiene (PB) component of a PI-PS or PB-PS may be selectively modified with vapors of osmium tetroxide, an aggressive staining agent that deposits osmium tetroxide on the diene carbon-carbon double bonds. This heavy metal reduces the etch rate of the diene component in a 10:1 $CF_4:O_2$ plasma. Thereby, the PS etches twice as fast as the PB or PI component and the pattern is transferred to the substrate. Thus, in some embodiments, it is contemplated that selective etching chemistries may be used to selectively remove one or more of the hydrophilic domains, the hydrophilic blocks of the amphiphilic block copolymer, the hydrophobic blocks of the amphiphilic block copolymer, or any hydrophobic domains of the self-assembled polymer layer.

In some embodiments, the plurality of pores may vary in size or diameter, in density (porosity), in depth, or in distance between pores, based on the choices of one or more of the amphiphilic block copolymer, the hydrophilic homopolymer, the application solvent, or the etchant used to remove the hydrophilic domains of the self-assembled polymer layer. For example, in some embodiments, the plurality of pores may be formed to have pore sizes of from about 50 nm to about 500 nm, pore depths of from about 50 nm to about 200 nm, and distances between pores of from about 50 nm to about 500 nm. In some embodiments, the plurality of pores in the exposed surface have a mean pore diameter from about 100 nm to about 200 nm. In some embodiments, the plurality of pores in the exposed surface define a surface area fraction of pores in the exposed surface of less than 50%, for example from about 10% to about 40%, from about 15% to about 35%, or from about 20% to about 35%. Once the plurality of pores is formed, the self-assembled polymer layer may have a porosity of from about 5% to about 50%, for example. In some embodiments, the hydrophilic domains may have a substantially cylindrical morphology in the self-assembled polymer layer, such that the plurality of pore formed by removing the hydrophilic domains may also be substantially cylindrical and oriented normal or nearly normal to the substrate surface.

In some embodiments of the methods for forming a nanopillared substrate surface, the exposed surface of the self-assembled polymer layer may be protected with a protective layer before through-holes are formed in the self-assembled polymer layer. The protective layer may be any material that can be deposited on the exposed surface of the self-assembled polymer layer and be resistant to etching techniques such as reactive-ion etching or plasma etching. Suitable protective layers in this regard may include, for example, metals such as aluminum, gold, and silver; dielectric materials such as oxides, nitrides, carbides, and silicon compounds; and plasma-resistant photoresists, including organic photoresists.

In some embodiments, the protective layer may comprise a metal layer such as an aluminum layer, a gold layer, or a silver layer. The protective layer or metal layer may be deposited by any suitable technique that forms the protective layer or metal layer while avoiding any clogging of the pores in the self-assembled polymer layer. In some embodiments, the protective layer, particularly when the protective layer is a metal layer, may be deposited by a technique such as glancing-angle metal deposition (GLAD). During a GLAD process, evaporated material (metal or metal dielectric) may be deposited on the exposed surface of the self-assembled polymer layer at a steep glancing angle such as from greater than 0° to about 10°, to about 20°, or to about 30°. For example, an aluminum metal layer may be applied by GLAD to the exposed surface at a glancing angle of from about 5° to about 10°, such as about 8.5°. In some embodiments, the glancing angle may be specifically chosen so as to deposit the protective layer or metal layer onto the exposed surface while ensuring that the material being deposited does not clog the plurality of pore.

In some embodiments, the protective layer or metal layer may be deposited on the exposed surface to a depth of from about 20 nm to about 250 nm, for example. Without intent to be bound by theory, it is believed that selection of the depth of the protective layer or metal layer may influence the size of nanopillars that will be formed during subsequent stages of the methods. For example, increasing the thickness of the protective layer or metal layer may decrease the heights, diameters, or both, of the nanopillars.

With the protective layer on the exposed surface, the self-assembled polymer layer may be etched through the plurality of pores to form through-holes through the self-assembled polymer layer to the substrate surface. In some embodiments, the plurality of pores may be etched through to form through-holes to the substrate surface using techniques such as plasma etching, reactive-ion etching, plasma drilling, or ion beam etching. In an exemplary embodiment, oxygen plasma etching may be used, for example, with a plasma power of about 80 W, an oxygen pressure of about 80 mTorr at 50 sccm flow rate, for about 2 minutes to 10 minutes or for about 5 minutes.

The methods for fabricating a nanopillared substrate surface may further include depositing a nanopillar-forming material onto the substrate surface through the through-holes. In some embodiments, the nanopillar-forming material may be any precursor compound that, when heated or allowed to cure or react, forms a material that will bond to the substrate or the substrate surface. In some embodiments, the material formed by the nanopillar-forming material may be the same material as the substrate or at least of the substrate surface. In other embodiments, the nanopillar-forming material need not form the same material as the substrate, provided the material that is formed by the nanopillar-forming material results in nanopillars that do not readily detach from the substrate surface. In other embodiments, the nanopillar-forming material may be the same material as the substrate or substrate surface itself in vapor or liquid phase, for example, such that the nanopillar-forming material simply settles within the through-holes. In an illustrative embodiment, if the substrate or substrate surface is a silicate glass, for example, the nanopillar-forming material may be any chemical compound such as a silane or siloxane that can react or change physical form to become the silicate glass. For example, the nanopillar-forming material may include silicon monoxide (SiO), which may oxidize to form silica ($SiO_2$). In other embodiments, the nanopillar-forming material may include one or more vapor-phase organometallic precursors of a metal, a metal oxide, or a glass. In some embodiments, the nanopillar-forming material may be deposited by a vapor-phase deposition. In other embodiments, the nanopillar-forming material may be deposited by a liquid-phase deposition.

The methods for fabricating a nanopillared substrate surface may further include removing the self-assembled polymer layer to expose a nanopillared substrate surface having a plurality of nanopillars thereon. In embodiments for which the hydrophilic domains were removed to form pores, which were subsequently etched to form through-holes, the portion of the self-assembled polymer layer that may remain on the substrate surface may be mostly composed of hydrophobic blocks from the amphiphilic block copolymer. Thus, the remaining portion of the self-assembled polymer layer may be removed by any solvent in which the hydrophobic blocks are soluble. In some embodiments, the self-assembled polymer layer may be removed by an organic solvent such as toluene, tetrahydrofuran, or benzene, for example. The plurality of nanopillars may have heights that vary depending on process parameters used throughout the methods according to embodiments here. In some embodiments, the plurality of nanopillars may have nanopillar heights ranging from about 50 nm to about 150 nm, for example. In some embodiments, the nanopillared substrate surface may be hydrophobic and may exhibit a water contact angle greater than 110°, for example.

In some embodiments, the nanopillared substrate surface may be subjected to one or more post treatments that may increase properties such as antireflective properties to visible light or hydrophobicity. Increased hydrophobicity of the nanopillared substrate surface may result in increase resistance of the surface to smudging, such as from fingerprints. In some embodiments, the post-treatment may include treating the nanopillared substrate surface with oxygen plasma. Post-treatment in oxygen plasma may increase the uniformity of heights of the nanopillars and increase both antireflective properties and anti-smudge properties of the nanopillared substrate surface. In some embodiments, a post-treatment, particularly applicable to glass substrates, may include coating the nanopillared substrate surface with a fluorosilane compound to increase hydrophobicity of the nanopillared substrate surface.

Thus, embodiments of methods for fabricating nanopillared substrate surfaces have been described. The methods according to various embodiments use a self-assembled polymer layer as a nanomask for forming nanopillar structures on the substrate surface. The methods embodied herein use minimal materials, are fast with high throughput, and have low processing costs. In some embodiments herein, for which a nanopillared substrate surface may be formed on a glass substrate, high quality, uniform, defect-free nanopillared surfaces may be formed over a large area, such as may be necessary for coating large window panes or large-area television screens. Additionally, as described herein, the surface density and diameter of nanopillars may be optimized for achieving anti-wetting, anti-smudge, anti-reflection, and optical scattering characteristics, any of which may be desirable for various commercial applications.

EXAMPLES

The embodiments described herein will be further clarified by the following examples.

Example 1

Polymer Materials

The polymer materials used in the nanomask fabrication process are listed in TABLE 1. These materials are purchased from polymer source, incorporation, Montreal, Canada. The abbreviation PS-b-PEO refers to a block copolymer of polystyrene and polyethylene oxide. The abbreviation PAA refers to poly(acrylic acid). All polymers were formed by living anionic polymerization. The number-average molecular weights for the PS-b-PEO block copolymers are provided in the form "X-b-Y," where X refers to the contribution of polystyrene blocks to the molecular weights, Y refers to the contribution of polyethylene oxide blocks to the molecular weights, and X+Y refers to the total number-average molecular weight. For example, a number-average molecular weight of 105-b-3 refers to a PS-b-PEO block copolymer having a total number-average molecular weight of 108,000 Dalton, to which 105,000 Dalton is contributed by polystyrene blocks and 3,000 Dalton is contributed by polyethylene oxide blocks.

TABLE 1

| Compound Identifier | Polymer Type | Number-Average Molecular Weight $M_N/10^3$ | Polydispersity Index $(M_w/M_N)$ |
| --- | --- | --- | --- |
| A1 | PS-b-PEO | 105-b-3 | 1.07 |
| A2 | PS-b-PEO | 150-b-35 | 1.09 |
| A3 | PS-b-PEO | 225-b-26 | 1.12 |
| A4 | PS-b-PEO | 384-b-8 | 1.15 |
| B1 | PAA | 5.7 | 1.09 |
| B2 | PAA | 8.0 | 1.07 |
| B3 | PAA | 14 | 1.08 |
| B4 | PAA | 26.5 | 1.12 |

Example 2

Polymer Solution

A polymer solution is prepared by mixing PS-b-PEO with PAA and dissolving the polymers in THF solution. Optionally, the samples may be heated to 60° C. to dissolve the polymer. The total polymer concentration is about 0.02 wt. % to about 4% wt. %, depending on the molecular weight of polymer and the desired film thickness. The polymer solution may then be filtered with a 0.2-μm syringe filter to be ready for deposition onto a glass surface.

Example 3

Polymer Film

A 2-inch by 2-inch (5.08 cm×5.08 cm) glass substrate is washed with acetone and isopropyl alcohol before applying the polymer solution prepared in Example 2. The glass surface does not require any pretreatment for this quick self-assembling and oriented film process. The polymer nanomask film is prepared at a specific room temperature (25° C.±3° C.) by spin coating process at 1000 rpm to 3000 rpm with an acceleration of 200 rpm/s to 1000 rpm/s for a total time of about 40 seconds. Alternatively, dip coating may be used.

Example 4

Polymer Nanomask Formation

Once the polymer film is applied, the polymer solution self-assembles to form a surface with cylindrical hydrophilic domains of the poly(acrylic acid). The polymer nanomask may be fabricated by selectively etching the cylindrical morphology of the polymer film with a polar solvent such as water or ethanol for 2 minutes to 10 minutes, for example, and subsequently drying the polymer film by forced airflow, for example.

In an exemplary system, polystyrene-block-polyethylene oxide PS-b-PEO is used as the amphiphilic block copolymer and poly(acrylic acid) (PAA) is used as the hydrophilic monomer. The amphiphilic block copolymer PS-b-PEO contains series of two types of blocks: hydrophobic polystyrene blocks and hydrophilic polyethylene oxide blocks. The polyacrylic acid is both hydrophilic and water soluble. After mixing the PS-b-PEO and PAA together in THF as an application solvent to form a polymer solution, the polymer solution may be spin-coated or dip-coated to form a thin polymer film after removal of the application solvent. During the solvent removal process, the polymer system may phase separate into a hydrophobic PS domain and hydrophilic PAA domains; while the PEO domain remains sandwiched between the PS and the PAA to increase the miscibility of these two incompatible sections. Because PAA is water soluble, the PAA can be easily dissolved away PAA domain by water or ethanol soaking. Once the PAA is removed, a porous polymer nanomask remains.

Nanomask samples were made by spin-coating from 2 wt. % weight solution of Compounds A2 and B1 in THF at mixing weight ratio of 7 parts Compound A2 to 3 parts Compound B1 Immediately after spin-coating and phase separation, PAA formed a circular domain with slightly indented shallow structures around 40 nm. Hydrophilic domain sizes ranged from 50 nm to 300 nm, with a mean pore size of 160 nm. The cylindrical domain area fraction was 30.8%, which was close to the weight ratio of PAA in the polymer solution. After etching away PAA by ethanol soaking, cylindrical holes with greater depths (about 90 nm) were formed, and the domain sizes ranged from 50 nm to 350 nm. The mean pore size after etching increased to 214 nm.

Figure 2A:
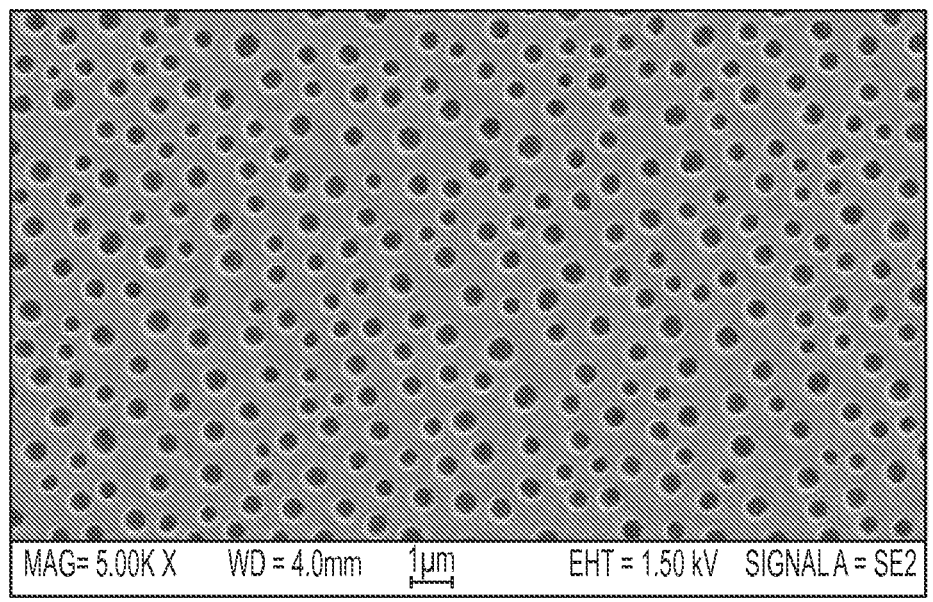
FIG. 2A is a scanning-electron micrograph of an exposed surface of a self-assembled polymer layer, prepared according to embodiments described herein, after hydrophilic domains are removed from the self-assembled polymer layer.
Figure 2B:
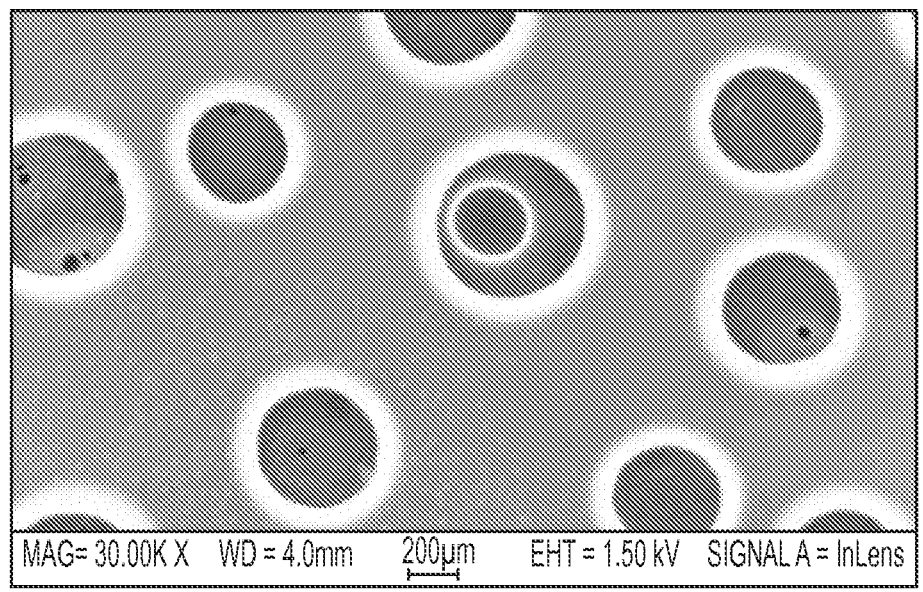
FIG. 2B is a scanning-electron micrograph of the exposed surface of FIG. 2A at a higher magnification.

FIGS. 2A and 2B are Scanning Electron Microscopy (SEM) images of the polymer mask after PAA removal. The samples depicted in these images were made by spin-coating a 2 wt. % polymer solution of Compounds A4 and B3 in THF at mixing weight ratio of 7 parts Compound A4 to 3 parts Compound B3. From the SEM image, it is apparent that cylindrical hole domains were distributed uniformly with no defects. It was noted that the cylindrical domains did not span through the exposed top surface of the self-assembled polymer layer to the bottom glass surface and that other layered structures were present beneath the top layer cylindrical holes.

Nanomask geometry may be tailored to achieve desired anti-reflection and anti-smudge properties. Even so, it has been demonstrated that the nanomask techniques can be tailored through controlling the pore sizes and pore area fractions by controlling polymer mixing ratios and polymer molecular weights.

For example, TABLE 2 shows the impact of the mixing ratio of the amphiphilic block polymer and the hydrophilic homopolymer. The samples noted in TABLE 2 each were made by spin-coating 2 wt. % polymer solutions of Compounds A2 (PS-b-PEO with $M_N$ 150,000-b-35,000) and B1 (PAA with $M_N$ 5,700) in THF at four different mixing weight ratios, namely, 9:1, 8:2, 7:3, and 6:4. It was observed that, as the PAA composition fraction increased from 10% to 40%, the mean pore diameter increased from 141 nm to 277 nm and the PAA domain area fraction increased from 12.8% to 39.8%.

TABLE 2

| Weight Ratio PS-b-PEO:PAA | Area Fraction | Mean Pore Diameter (nm) |
|---|---|---|
| 9:1 | 12.8% | 141 |
| 8:2 | 21.5% | 202 |
| 7:3 | 32.1% | 227 |
| 6:4 | 39.8% | 277 |

The impact of molecular weight of the hydrophilic homopolymer is evident from the data of TABLE 3. The amphiphilic block polymer was Compound A4 (PS-b-PEO with $M_N$ 375,000-b-8,000) and the hydrophilic homopolymers were Compound B1 (PAA with $M_N$ of 5,700) and Compound B3 (PAA with $M_N$ of 14,000). The samples were made from 2 wt. % polymer solutions in THF solution with a mixing ratio block polymer to homopolymer of 7:3. The data show that when the homopolymer PAA molecular weight decreased from 14,000 to 5,700, the mean pore size decreased from 495 nm to 241 nm, while the area fractions remained similar.

TABLE 3

| $M_N$ of PAA | Area Fraction | Mean Pore Diameter (nm) |
|---|---|---|
| 14,000 | 25.2% | 495 |
| 5,700 | 24.7% | 241 |

Example 5

Polymer Nanomask as a Deposition Mask

Glancing-angle metal deposition is carried out on the polymer nanomask, such as those formed in the above Examples on a 2-inch by 2-inch (5.08 cm×5.08 cm) glass substrate, by mounting the sample in a sealed evaporation chamber. A substrate holder is suspended approximately 10 inches (27.4 cm) above an aluminum evaporation boat. The substrate is tilted to result in a glancing angle deposition at about 8.5°. This oblique deposition coats the PS-PEO-PAA nano-mask without clogging the well-defined nano-pores. The holder is equipped for rotating the substrate about its normal axis approximately one revolution every ten seconds during deposition.

Two different thicknesses of aluminum coating were tested. In a first test, a 40-nm layer of aluminum was deposited at the glancing angle over an entire nano-masked substrate. Then, one half of the same sample was covered with foil and approximately 200 nm of aluminum was additionally deposited at the glancing angle. Each portion (40 nm and 240 nm) was subsequently studied for the impact of this thickness variation at the glancing angle of about 8.5° on through-hole morphology.

Through-hole formation was conducted on the samples using oxygen etching. The substrate sample having 40-nm and 240-nm aluminum thicknesses on each half of sample was placed in a reactive ion etching (RIE) chamber (UnAxis 790, USA), and then subjected to a directional $O_2$ plasma etch (80 W, 80 mTorr $O_2$ at 50 sccm for 5 minutes). This process, illustrated in FIG. 3B, was performed to expose the substrate directly underlying the pore-holes, through which material would be deposited to form the nanopillars. After the five-minute $O_2$ plasma exposure, the sample was removed and placed in an evaporation chamber for the final deposition. As an alternative to reactive-ion etching, oxygen plasma cleaner can also be used to remove unprotected polymer.

A layer of SiO (Cerac, USA) nanopillar-forming material was deposited into the through-holes from a resistively heated boat (ME-2 baffle boat; RD Mathis, USA) at a rate of 1 nm per second to form nanopillars that were 100 nm tall. The deposited SiO oxidized in the through-holes to form $SiO_2$ nanopillars. The nanopillars were revealed when the sample was then ultrasonicated in tetrahydrofuran (THF) for 1 hour to remove any remaining polymer from the self-assembled polymer layer.

Figure 5A:
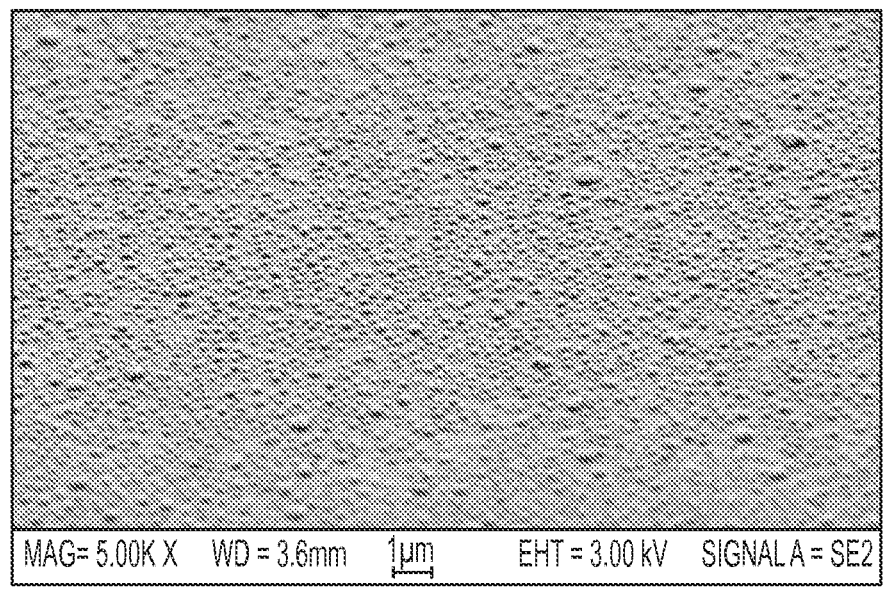
FIG. 5A is a scanning-electron micrograph of a glass substrate having a nanopillared surface prepared according to embodiments described herein.
Figure 5B:
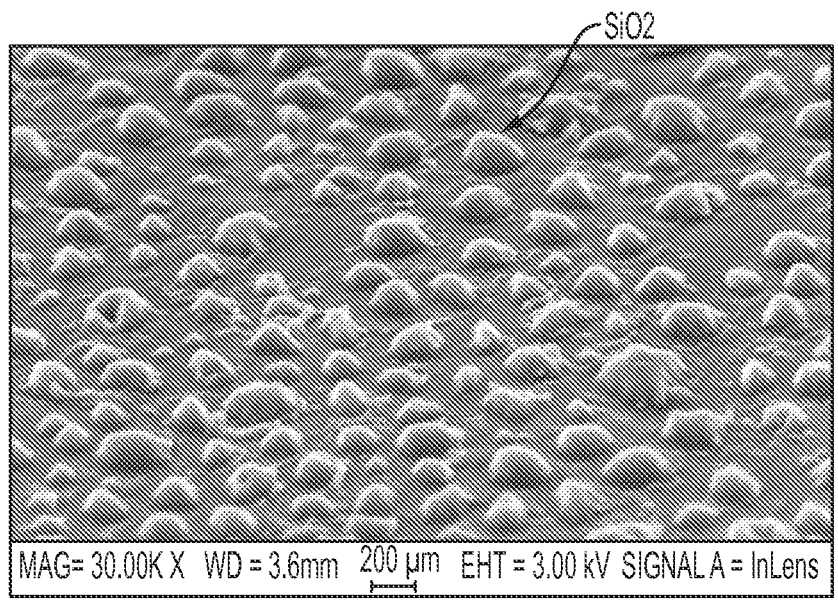
FIG. 5B is a scanning-electron micrograph of the nanopillared surface of FIG. 5A at higher magnification.

Scanning-electron micrographs of the nanopillared substrate surface are provided in FIGS. 5A and 5B. Both images are SEM 60° tilt views of $SiO_2$ nano-post structures from 240 nm Al GLAD step. The original polymer mask is from 2% weight solution of Compounds A2 and B1 in THF at mixing weight ratio of 6 parts Compound A2 to 4 parts Compound B1. FIG. 5A is low magnification view showing a large area of as-deposited $SiO_2$ nanopillars, and FIG. 5B is an enlarged view showing nanopillars and pyramid-like structures. The highest nanopillars were found to have heights of about 100 nm. It is believed that smaller nanopillars that formed with the 100-nm nanopillars may have resulted from closure of nanomask holes during the $SiO_2$ deposition.

By atomic force microscopy it was verified that pore size could be engineering by the parameters of the GLAD process. In the GLAD process, the diameters of the nanopillars could be modified from a single nano-mask's pore-hole distribution by controlling the GLAD deposition thickness. It was found that increasing of the GLAD-layer thickness (aluminum thickness) from 40 nm to 240 nm, the heights of the nanopillars formed after the $SiO_2$ deposition were significantly smaller.

Example 6

Anti-Reflection and Anti-Smudge Properties

Reflectivity spectra of the nanopillared substrate surfaces prepared in the above examples were acquired using a commercially available thin-film surface spectral-measurement tool (F10-RT, Filmetrics, USA). To evaluate anti-smudge characteristics, the $SiO_2$ nanopillars were first treated with oxygen plasma at 75 W, 0.5 Torr for 2 minutes and then were coated with (tridecafluoro-1,1,2,2-tetrahydrooctyl)trichlorosilane in a vacuum dessicator for 10 minutes. Haze and transmission properties were measured with a Haze-gard Plus optical system (LE04; BYK-Gardner, Germany). Water contact angles were measured on a Kruss DSA30 Goniometer.

Figure 6:
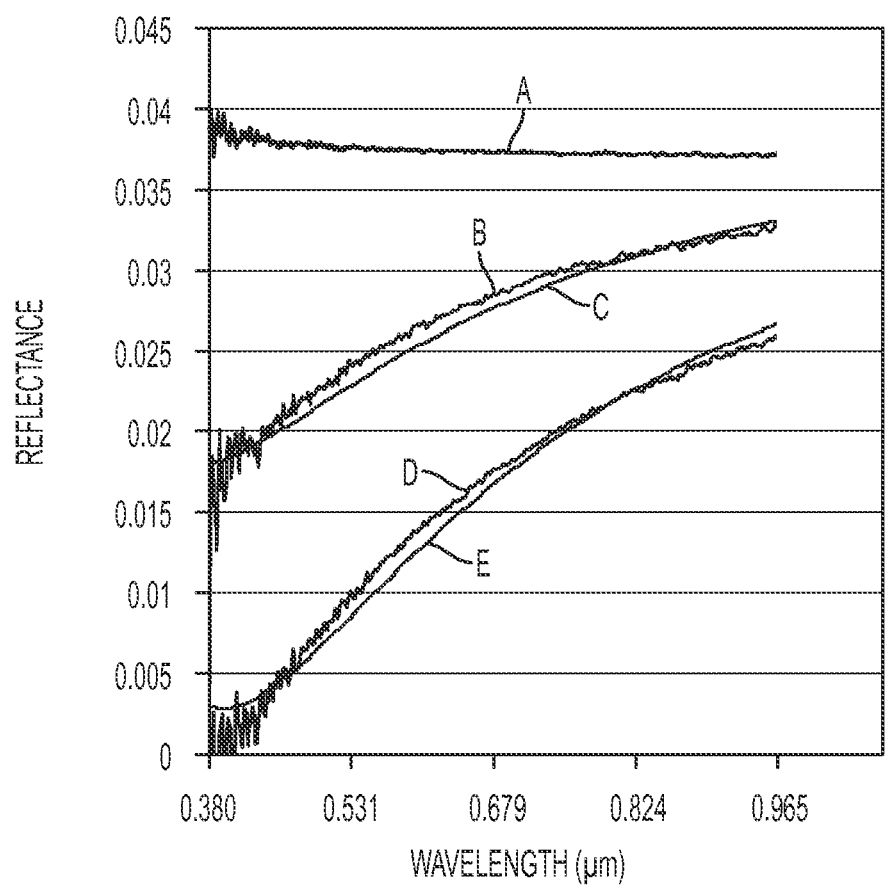
FIG. 6 is a graph of reflectivity to incident light in the visible spectrum of various substrates, including substrates having nanopillared surfaces prepared according to embodiments described herein.

FIG. 6 shows the reflectance spectra of $SiO_2$ nanopillar surfaces fabricated by the nanomask procedures described above. Line A represents surface reflectance of bare Gorilla™ Glass. Line B is the measured reflectance spectrum of the 240-nm nanomask nanopillared substrate surface. Line C is a modeled reflectance spectrum of the 240-nm nanomask nanopillared substrate surface. Line D is the measured reflectance spectrum of the 40-nm nanomask nanopillared substrate surface. Line E is a modeled reflectance spectrum of the 40-nm nanomask nanopillared substrate surface.

Theoretical optical modeling results are compared alongside the measured data. The spectra were processed to present the reflectance of the nano-pillar surfaces only. All of the substrate surfaces used were Corning 2318 (Gorilla™ Glass) exclusively. All optical modeling was accomplished using commercially available code solving Maxwell differential equations of user defined structures numerically by finite element methods (GSolver420B, Grating Software Development Co., USA). It was assumed that: (1) all film materials did NOT absorb photons; (2) the material refractive index was constant over the visible wavelength region from 380 nm to 1050 nm; and (3) the nanopillar region's refractive index could be calculated solely on the basis of its volume-weighted average of air and nanopillar material distributed in the surface region.

The SiO nanopillar-forming material was independently measured as having an average refractive index of about 1.67 in the visible wavelengths from 300 nm to 700 nm. A 280-nm thick film was used for this measurement. It should be noted that while $SiO_2$ bulk material may have a refractive index of about 2.3, the SiO thin film is very sensitive to the manner in which it was deposited. The SiO used for evaluation here was formed by slowly evaporating SiO at a rate of 10 Å/s under $10^{-5}$ Torr vacuum conditions, conditions suitable for oxidation. The volume fraction of SiO material in the surface was estimated at the high end of the range, for both surfaces processed by the 40-nm and 240-nm nanomasks, using image analysis software (Image-Pro 6.2, USA). The higher end volume fractions measured were: about 0.4 volume fraction ("40 nm nano-mask" surface), and about 0.2 volume fraction ("240 nm nano-mask" surface). The lower end volume fractions were estimated using values needed to fit the measured reflectance spectra while maintaining a constant material surface thickness that was measured (about 85 nm). Those lower end volume fractions measured were: about 0.24 volume fraction ("40 nm nano-mask" surface), and about 0.10 volume fraction ("240 nm nano-mask" surface). The maxima in the range can be ascribed to the morphology of the nanopillars, and the error associated with estimating the nanopillars as cylinders versus or humped "yurt-like" structures.

The well-fitted reflectance spectra in FIG. 6, using parameter values consistent with independent measurements, indicates the optical refractive index values possible with the nanopillar structures, particularly for achieving anti-reflection surface behavior. It is believed that refractive index values near 1.23 may result in 0% reflection in the visible wavelength region with a single film layer. The refractive index values of 1.07 and 1.16 associated with the optical behavior of the nanopillars formed in the above examples illustrates the utility of the nanopillared substrate surfaces for engineering of anti-reflecting surfaces.

Nano-textured surfaces may exhibit anti-wetting "amphipobic" behavior when properly designed. The nanopillars described herein, suitable for achieving anti-wetting behavior, because the area fraction of the nanopillars on the surface produced from the 240-nm nanomask were near the 0.1 at the low-end.

Water contact angle measurements, conducted as described above, were performed on a flat fluorosilane surface, on the 40-nm nanomask SiO nanopillared surface, and on the 240-nm nanomask SiO nanopillared surface. The water contact angle of the flat fluorosilane surface was about 112°. The water contact angle of the 40-nm nanomask SiO nanopillared surface was about 118°. The water contact angle of the 240-nm nanomask SiO nanopillared surface was about 116°. Thus, the nanopillared surfaces were more hydrophobic than the fluorosilane-treated flat surface.

Quantified fingerprint transfer and optical characterization (transmission, haze) measurements were performed and results are summarized in FIG. 7. The table of FIG. 7 shows the quantitative fingerprint transfer, transmission, and haze measurements of a nanopillared sample prepared by the methods described above. Simulated fingerprints were produced using a standardized fingerprint fluid solution (30% triolein, 25% oleic acid, 25% cotyl palmitate, 15% squalene, 2.5% cholesterol, 2.5% cholesterol oleate, and dye-labeled lipid (B-3824, Molecular Probes, USA) that was applied with an automated inking and fingerprint stamping machine that maintained a constant 3 psi pressure over a 10-second stamping cycle. During half of that cycle, the fingerprint stamp was rocked back and forth in one direction by an automated gimbal, mimicking the forensic practice of rocking a criminal's finger during fingerprinting. The fingerprint stamp was then rocked back and forth in the orthogonal direction in the other half cycle, followed by standardized image acquisition to ensure reliable and quantifiable fingerprint adhesion.

In FIG. 7, the nanopillared sample is compared with bare glass and fluorosilane-coated samples. The left column lists three measured samples: bare glass (Corning 2318), fluorosilane-coated bare glass (EC173), and a nanopillared glass. The fluorosilane coating was DC2634, available from Dow-Corning and was present on both the EC173 and the nanopillared samples. The processed image column of FIG. 7 shows the images used for the analysis, and the integrated intensity column shows the measured values quantifying the fingerprint material transfer for each sample. The processed nanopillar morphology conferred by the methods described above were found to exhibit measurable and significant anti-smudge behavior over simple fluorosilane-coated flat glass samples, as indicated by the low integrated intensity values.

FIG. 7 illustrates the inhibition of the fingerprint transfer due to the nanopillar structure morphology conferred by the methods described above. The nano-structured surface inhibits nearly 23% less fingerprint transfer compared with bare glass, while glass simply coated with fluorosilane alone inhibits only 12% relative to bare glass. The absence of the nano-structured geometry clearly limits the fingerprint transfer inhibition property. It is also observed that the high transmission (94%) and low haze (0.3%) properties of the glass substrate are retained, because the nano-texture features are well below the MIE-scattering properties associated with substantial nano-particle scattering (<200 nm), thus ensuring the nano-texture structure does not negatively influence the optical performance of the textured glass surface. These observations also confirm the ability to combine both the anti-reflection and anti-smudge properties of nanopillared substrate surfaces for other possible applications.

It should be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A method for fabricating a nanopillared substrate surface, the method comprising:
applying a polymer solution to a substrate surface of a substrate, the polymer solution containing:

an amphiphilic block copolymer having hydrophobic blocks and hydrophilic blocks;

a hydrophilic homopolymer that is chemically compatible with the hydrophilic blocks of the amphiphilic block copolymer; and an application solvent, evaporating the application solvent to cause the amphiphilic block copolymer and the hydrophilic homopolymer in the polymer solution to self-assemble on the substrate surface to form a self-assembled polymer layer having hydrophobic domains of the hydrophobic blocks adjacent to the substrate surface, hydrophilic domains of the hydrophilic homopolymer extending into the self-assembled polymer layer from an exposed surface of the self-assembled polymer layer opposite the substrate surface, and a transitional region of the hydrophilic blocks of the amphiphilic block copolymer between the hydrophobic domains and the hydrophilic domains;

selectively removing at least a portion of the hydrophilic domains to form a plurality of pores in the exposed surface of the self-assembled polymer layer, wherein the plurality of pores do not span from the exposed surface to the substrate surface;

depositing a protective layer on the exposed surface after at least the portion of the hydrophilic domains is removed from the self-assembled polymer layer;

etching through the plurality of pores after the protective layer is deposited to form through-holes from the plurality of pores, the through-holes being defined through the self-assembled polymer layer from the exposed surface to the substrate surface;

depositing a nanopillar-forming material onto the substrate surface through the through-holes; and removing the self-assembled polymer layer to expose a nanopillared substrate surface having a plurality of nanopillars thereon.

2. The method of claim 1, wherein the weight ratio of the amphiphilic block copolymer to the hydrophilic homopolymer in the polymer solution is from about 1:1 to about 10:1.

3. The method of claim 1, wherein the amphiphilic block copolymer and the hydrophilic homopolymer have polydispersity indices of from 1.00 to about 1.20.

4. The method of claim 1, wherein the amphiphilic block copolymer comprises a PS-b-PEO block copolymer having polystyrene hydrophobic blocks and polyethylene oxide hydrophilic blocks.

5. The method of claim 1, wherein the hydrophilic homopolymer comprises poly(acrylic acid).

6. The method of claim 1, wherein:

the amphiphilic block copolymer comprises a PS-b-PEO block copolymer comprising from 60 wt. % to 98 wt. % polystyrene hydrophobic blocks and from 2 wt. % to 40 wt. % polyethylene oxide hydrophilic blocks, based on the total weight of the amphiphilic block copolymer, the polystyrene hydrophobic blocks having a number-average molecular weight of from about 100,000 Dalton to about 500,000 Dalton; and the hydrophilic homopolymer comprises poly(acrylic acid) having a number-average molecular weight of from 2000 Dalton to 30,000 Dalton.

7. The method of claim 1, wherein the application solvent comprises tetrahydrofuran.

8. The method of claim 1, wherein the plurality of pores in the exposed surface have a mean pore diameter from about 100 nm to about 200 nm.

9. The method of claim 1, wherein the plurality of pores in the exposed surface define a surface area fraction of pores in the exposed surface of less than 50%.

10. The method of claim 1, wherein the protective layer is a metal layer or a dielectric layer and depositing the protective layer on the exposed surface comprises:

depositing the protective layer to a predetermined protective-layer thickness by glancing angle deposition, wherein the glancing angle deposition is performed at a glancing angle that deposits the protective layer on the exposed surface and does not clog the plurality of pores with material being deposited.

11. The method of claim 10, wherein the protective layer comprises a metal selected from the group consisting of aluminum, gold, and silver.

12. The method of claim 10, wherein the glancing angle is from 5° to 10°.

13. The method of claim 10, wherein the predetermined protective-layer thickness is from about 20 nm to about 250 nm.

14. The method of claim 1, wherein the substrate is glass.

15. The method of claim 1, wherein the nanopillar-forming material is a glass-forming material selected from the group consisting of silanes and siloxanes.

16. The method of claim 1, wherein selectively removing at least a portion of the hydrophilic domains comprises selective etching of the hydrophilic domains with water or an alcohol.

17. The method of claim 1, wherein the hydrophilic domains of the self-assembled polymer layer are concentrated at the exposed surface of the self-assembles polymer layer.

18. The method of claim 1, wherein evaporating the application solvent comprises drying the polymer solution on the substrate surface by forced airflow.

19. The method of claim 1, wherein the amphiphilic block copolymer comprises from 60 wt. % to 98 wt. % hydrophobic blocks and from 2 wt. % to 40 wt. % hydrophilic blocks, based on the total weight of the amphiphilic block copolymer.

20. A method for fabricating a nanopillared glass substrate surface having antismudge or antireflective properties, the method comprising:

applying a polymer solution to a substrate surface of a glass substrate, the polymer solution containing:

a PS-b-PEO block copolymer comprising from 60 wt. % to 98 wt. % polystyrene blocks and from 2 wt. % to 40 wt. % polyethylene oxide blocks based on the total weight of the block copolymer, the polystyrene blocks having a number-average molecular weight of from 100,000 Dalton to 500,000 Dalton;

a poly(acrylic acid) homopolymer having a number-average molecular weight of from 2000 Dalton to 30,000 Dalton; and an application solvent that dissolves both the PS-b-PEO block copolymer and the poly(acrylic acid) homopolymer, drying the polymer solution on the substrate surface by forced airflow, whereby the PS-b-PEO block copolymer and the poly(acrylic acid) homopolymer self-assemble on the substrate surface to form a self-assembled polymer layer in which polystyrene blocks are adjacent to the substrate surface, poly(acrylic acid) domains extend into the self-assembled polymer layer from an exposed surface of the self-assembled polymer layer opposite the substrate surface, and a transitional region of polyethylene oxide blocks is between the polystyrene blocks and the polyethylene oxide blocks;

etching the self-assembled polymer layer in water or an alcohol to selectively remove at least a portion of the poly(acrylic acid) domains and form a plurality of pores in the exposed surface of the self-assembled polymer layer, wherein the plurality of pores do not span from the exposed surface to the substrate surface;

depositing a protective layer on the exposed surface after the selective etching by glancing angle deposition of the protective layer at a glancing angle of from 5° to 10°;

etching through the plurality of pores after the protective layer is deposited to form through-holes through the self-assembled polymer layer to the substrate surface;

depositing onto the substrate surface through the through-holes a nanopillar-forming material chosen from silicon monoxide, silanes, and siloxanes; and removing the self-assembled polymer layer to expose a nanopillared glass substrate surface having a plurality of nanopillars thereon that impart antismudge or antireflective properties to the substrate surface.

\* \* \* \* \*